US006245397B1

(12) United States Patent
Watanabe et al.

(10) Patent No.: US 6,245,397 B1
(45) Date of Patent: Jun. 12, 2001

(54) MARKING METHOD AND MARKED MOLDING

(75) Inventors: Kazuyuki Watanabe, Mikata-gun; Hirofumi Kikuda, Tsuruga; Toyoshi Fukumura, Maizuru, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/210,984

(22) Filed: Dec. 15, 1998

(30) Foreign Application Priority Data

Dec. 18, 1997 (JP) .................................................. 9-348936

(51) Int. Cl.[7] .......................... C23C 14/32; C23C 26/02; G03C 8/50; B44C 1/17

(52) U.S. Cl. .......................... 427/596; 430/200; 430/201; 430/363; 156/155; 156/230; 156/232; 156/272.8

(58) Field of Search .................................... 427/561, 596, 427/597, 555; 430/200, 201, 363; 156/152, 155, 230, 232, 272.8

(56) References Cited

U.S. PATENT DOCUMENTS

| | | | | |
|---|---|---|---|---|
| H158 | * | 11/1986 | Frausto et al. | 219/121 LD |
| 3,964,389 | * | 6/1976 | Peterson | 427/385 |
| 3,978,247 | * | 8/1976 | Braudy et al. . | |
| 4,064,205 | * | 12/1977 | Landoman . | |
| 4,245,003 | * | 1/1981 | Oransky et al. . | |
| 4,588,674 | * | 5/1986 | Stewart et al. | 430/273 |
| 4,702,958 | * | 10/1987 | Itoh et al. | 428/323 |
| 4,743,463 | * | 5/1988 | Ronn et al. . | |
| 5,413,629 | | 5/1995 | Yasui et al. . | |
| 5,492,861 | * | 2/1996 | Opower | 427/597 |
| 5,618,370 | | 4/1997 | Popat et al. . | |
| 5,757,313 | | 5/1998 | Meneghini et al. . | |
| 5,945,249 | * | 8/1999 | Patel et al. | 430/200 |
| 5,962,181 | * | 10/1999 | Deams et al. | 430/200 |
| 6,096,159 | * | 8/2000 | Ito et al. | 156/272.8 |
| 6,121,991 | * | 9/2000 | Paz-Pujalt et al. | 430/200 |
| 6,139,661 | * | 10/2000 | Cronin et al. | 156/272.8 |

FOREIGN PATENT DOCUMENTS

| | | | |
|---|---|---|---|
| 0201627 | | 11/1986 | (EP) . |
| 0201627A1 | * | 11/1986 | (EP) . |
| 0605803A1 | * | 7/1994 | (EP) . |
| 0605803 | | 7/1994 | (EP) . |
| 62-59663 | | 4/1981 | (JP) . |
| 61-11771 | | 7/1982 | (JP) . |
| 1-267092 | | 10/1989 | (JP) . |
| 60-4094 | | 1/1995 | (JP) . |
| WO88/04237 | * | 6/1988 | (WO) . |
| WO93/03928 | * | 3/1993 | (WO) . |
| WO 95 13195 | | 5/1995 | (WO) . |

OTHER PUBLICATIONS

*IBM Tech. Disc. Bull.*, "Prenting by Means of a Laser Beam" Roshon et al, vol. 7, #3, Aug. 1964.*

*IBM Tech. Disc. Bull.*, "Enhancing Ribbon Transfer Using Laser Printing" R.J. Von Gutfeld vol. 17, #6, Nov. 1974.*

* cited by examiner

*Primary Examiner*—Marianne Padgett
(74) *Attorney, Agent, or Firm*—McDermott, Will & Emery

(57) ABSTRACT

A method of forming a mark on a molding, which includes the steps of: (a)feeding a film having a first surface and a second surface (b) disposing a paint containing a paint component on the first surface of the film, where the paint has a lower melting point than the film, (c) positioning the film on the surface of a molding so that the paint contacts the surface of the molding, and (d) forming a mark by emitting an energy ray from the second surface side of the film, and transferring and disposing the paint positioned on the first surface of the illuminated portion on the surface of the molding, thereby forming a mark. The molding is a resin molding formed of a material containing resin. In this constitution, a mark with a desired color can be formed on a molding. The mark is formed easily and inexpensively. A mark having an excellent wear resistance is formed. A mark having an excellent precision is easily formed on the surface of a molding having a complicated shape.

35 Claims, 8 Drawing Sheets

MARKING METHOD AND MARKED MOLDING

FIELD OF THE INVENTION

The present invention relates to a marking method of displaying characters and patterns on moldings by laser beam, electron beam, heat ray or other energy ray, and to marked moldings.

BACKGROUND OF THE INVENTION

The following methods have been known conventionally as the marking method on resin molding by using energy ray such as laser beam. As disclosed in Japanese Patent Publication No. 61-11771 and Japanese Patent Publication No. 62-59663, a resin is mixed with a filler which is deformed by the action of the laser beam or energy ray, and the mixture is injection-molded to obtain a resin molding. The resin molding is exposed to energy rays such as a laser beam to be partly discolored, so that a desired character or pattern is formed. As disclosed in Japanese Laid-open Patent No. 60-4094 and Japanese Laid-open Patent No. 1-267092, a plurality of coat films are formed on the surface of a resin molding by applying paints of different colors and only the surface layer or a plurality of coat films are partially removed by a laser beam, so that the desired color is left over.

Exemplary conventional methods are described below while referring to FIG. 12 and FIG. 13. FIG. 12 is a front view for explaining a method of discoloring the filler in the resin molding, and FIG. 13 is a sectional front view for explaining a method of removing the coat film of the paint on the resin molding. In FIG. 12, the surface layer containing a paint powder 4 which is discolored by the action of a laser beam is formed on the surface of a resin molding 3. A laser beam 1 controlled by a deflection device 2 is emitted to the surface layer, and the portion exposed to the laser beam is changed in color, and a mark 5 is formed. As the laser beam 1 is emitted by deflection control according to the desired character or pattern, the mark 5 is formed on the surface layer of the resin molding 3.

In FIG. 13, three color paints are applied sequentially on the surface of a resin molding 6, and three layers of coat films 7, 8, 9 are formed. A laser beam 1 controlled by a deflection device 2 is controlled in reflection according to the emitting position corresponding to a desired character or pattern, and is also controlled in the amount of energy, and is emitted to the surface coat film 7 side of the resin molding 6. Depending on the amount of energy, the coat film 7, coat film 8 or coat film 9 having a different color is cut off, and characters and patterns having different colors are formed as required.

However, in the conventional marking method by making use of discoloration of the filler of the resin molding by laser beam, characters or patterns of different colors cannot be formed on one resin molding. On the other hand, in the conventional marking method by removing the coat film partly by irradiation with laser beam by preliminarily formed coat films on the surface of the resin molding, by forming coat film layers in multiple layers by different colors, combination of various color marks is possible, but it requires more steps in coating and drying.

It is hence an object of the invention to present a method of marking desired characters or patterns, and making the molding with different colors, not limited in mark color, at low cost.

SUMMARY OF THE INVENTION

The marking method of forming a mark on a molding of the present invention comprises (a) a step of feeding a film having a first surface and a second surface, (b) adhering, fixing, affixing or disposing a paint on the first surface of the film wherein the paint has a lower melting point than the film, (c) a step of positioning the film on the surface of a molding so that the paint contacts the surface of the molding, and (d) a step of forming a mark by emitting an energy ray from the second surface side of the film, and transferring and disposing the paint positioned on the first surface of the illuminated portion on the surface of the molding, thereby forming a mark.

The marked molding of the present invention is a molding manufactured by the above method.

Preferably, the molding is a resin molding formed of a material containing resin.

Preferably, the molding has at least one surface selected from the group consisting of (i) curved surface, (ii) concave surface, (iii) convex surface, (iv) convexo-concave surface, and (v) flat surface.

Preferably, the molding has a coarser surface roughness than the first surface of the film.

Preferably, the energy ray is controlled in emitting position by a deflection device.

Preferably, the energy ray is emitted on the paint by passing through the film without causing any effects on the film.

Preferably, the energy ray is a laser beam.

Preferably, the paint component has a specific color, and the mark has the specific color.

Preferably, the paint component contains at least one of dye and pigment.

Preferably, the paint can be melted by irradiation with the energy ray, and when the film is irradiated with the energy ray, the paint is melted and transferred to the surface of the molding.

Preferably, the paint can be sublimated when irradiated with the energy ray, and when the film is irradiated with the energy ray, the paint is sublimated and transferred to the surface of the molding.

In accordance with the present invention, a mark with a desired color can be formed on a molding. The mark is formed easily and inexpensively. A mark having an excellent wear resistance is formed. A mark having an excellent precision is easily formed on the surface of a molding having a complicated shape.

DETAILED DESCRIPTION OF THE INVENTION

Figure 1:
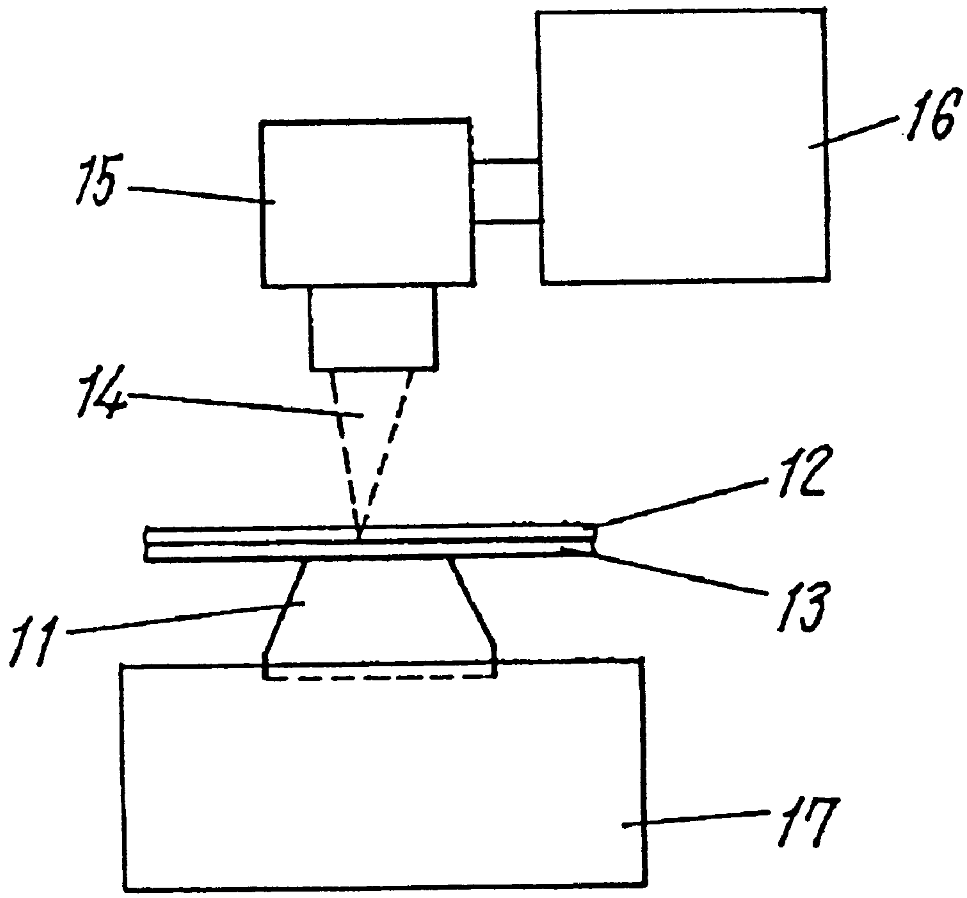
FIG. 1 is a front view for explaining a marking method on a molding in a first embodiment of the present invention.

A marking method in an embodiment of the invention comprises a step of feeding a film made of a heat resistant resin having a paint placed on a first surface, a step of contacting the paint side to the surface of a molding as the object of transfer, a step of emitting an energy ray controllable in emitting position by a deflection device on a second surface at the back side of the film free from paint, and a step of transferring and fixing the paint only in the illuminated portion to the surface of the molding from the film surface. In this method, regardless of the molding as the object of transfer, the color of the mark can be changed by replacing the film made of heat resistant resin preliminarily coated with paint. As a result, moldings marked with desired colors are obtained easily and at low cost.

In accordance with the present invention, by using a sublimating dye as the paint, it is preferred to vaporize the dye by irradiation with energy ray, and mark by permeating the dye vaporized from the surface of the molding. In this method, the mark permeating to the surface layer of the molding is obtained. As a result, a mark having an excellent wear resistance is formed.

In accordance with the present invention, which utilizes a transparent or translucent film made of heat resistant resin, it is preferred to mark by emitting a YAG laser beam having a short wavelength. The YAG laser beam is a beam generated from an apparatus using yttrium-aluminum-garnet material. Since the YAG laser beam is short in wavelength, the beam penetrates through the film completely and the energy is concentrated on the surface layer of the molding, and therefore the texture of the surface layer is activated, and fixing of fused paint or permeation of vaporized paint is easier. As a result, a clearer mark, which is excellent in wear resistance is formed.

In addition, the thickness of the film is preferred to be about 10 micrometers to about 200 micrometers. In this method, since the film has an adequate strength, the film can be handled easily by a machine, and the transmissivity of energy ray is superior. Hence, melting or transfer of the paint disposed on the film, or vaporization of paint is easy.

In addition to the foregoing, the film of the present invention has a specified thickness and a specified folding and bending hardness. While holding both sides of the film so as to have a U-form deflection with the paint applied first surface on the outside, the first surface having the paint disposed thereon is pressed to contact tightly with the surface of the molding, and the energy ray is emitted from the back side of the film in this state. In this method, using a simple marking device, the film is tightly formed on the molding, and a desired mark is provided.

In another embodiment, when the surface of the molding to be marked has a convex part, while the first surface of the film having the paint disposed thereon is held in a state of covering the convex part of the molding, the film is pulled from both sides, so that the film contacts the surface of the convex part to be marked, and energy ray is emitted in this state. In this method, the film can be contacted tightly to the molding having a convex appearance, so that the desired mark can be formed at an appropriate position.

In another embodiment, when the surface of the molding to be marked has a convex part, while the first surface of the film having the paint disposed thereon is held in a state of covering the convex part, the surrounding of the molding is evacuated, so that the film contacts the surface of the convex part to be marked, and laser beam or energy ray is emitted in this state. The film can be contacted tightly to the molding having a convex appearance, so that the desired mark can be formed.

In yet another embodiment, the paint is a paint mixed with a peelable adhesive having a tacky adhesiveness. Using an elastic piece having a shape corresponding to the surface shape of the molding to be marked, by pressing the film which is coated with the paint on one side, the film tightly contacts the surface of the molding. An energy ray is then emitted. According to this embodiment, the side of the film having the tacky adhesive paint is contacted and held on the surface of the molding to be marked. Accordingly, on the surface of the molding having various shapes such as flat, convex, concave or other surface, the film can be appropriately adhered tightly, and therefore a desired mark can be formed, and then the film can be easily peeled off.

As a result of this marking method, marked moldings having various marks can be manufactured. Specifically, marks having various colors, desired characters and patterns, and moldings having excellent wear resistant marks can be obtained.

With regard to the molding, a thermoplastic resin is preferred. In this case, the degree of freedom of selection of materials for molding is large. Hence, it is possible to utilize various colors, shapes, colors, and patterns. The molding main body is used in the key top of a keyboard used as an input device of an electronic information appliance. In this constitution, key tops of different marks in a same shape, or one key top having colors in plural colors will provide marks of high quality and excellent wear resistance. Usable materials for the molding include thermoplastic resin, thermosetting resin, compound resin containing filler, ceramic materials, metal materials, and others. In particular, the resin is preferable for the molding, and the above effects will be further enhanced in this case.

In this constitution, as the energy ray, laser beam, electron beam, electron ray, heat ray, and other energy ray having high energy may be used.

Preferred embodiments of marking method and marked molding of the invention are described below while referring to the drawings.

Exemplary Embodiment 1

Figure 2:
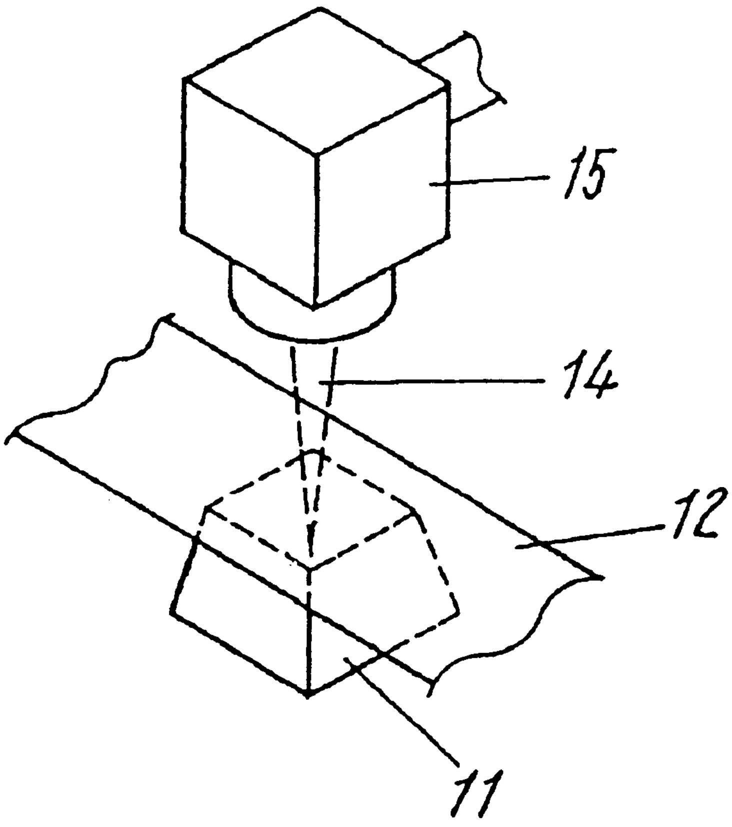
FIG. 2 is a perspective view showing a marking execution state in the first embodiment.
Figure 3:
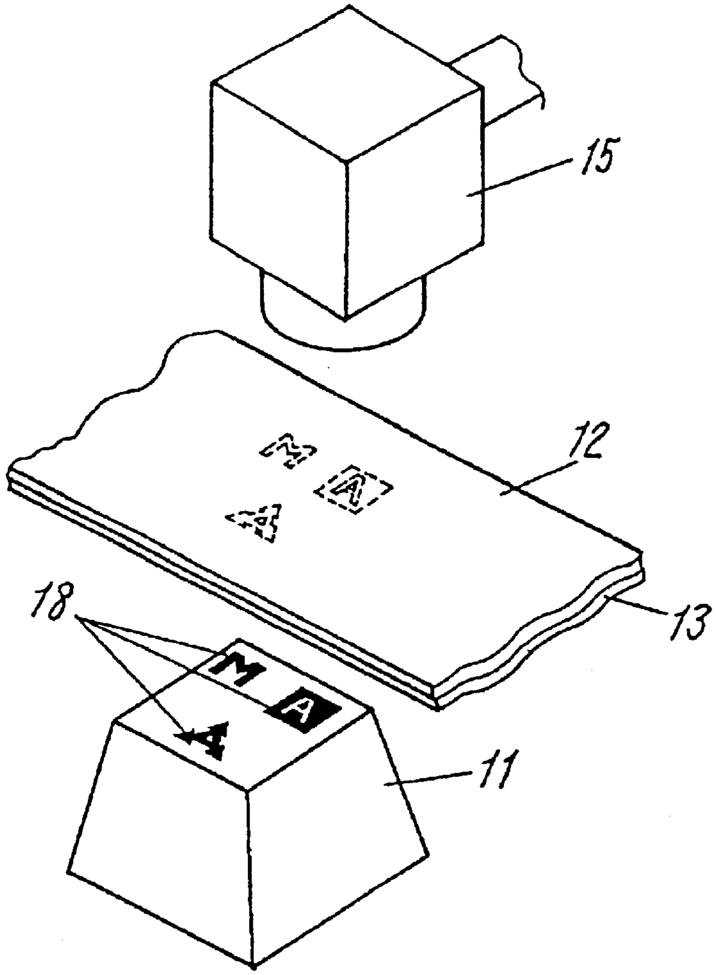
FIG. 3 is a perspective view showing a marking finished state in the first embodiment.
Figure 4:
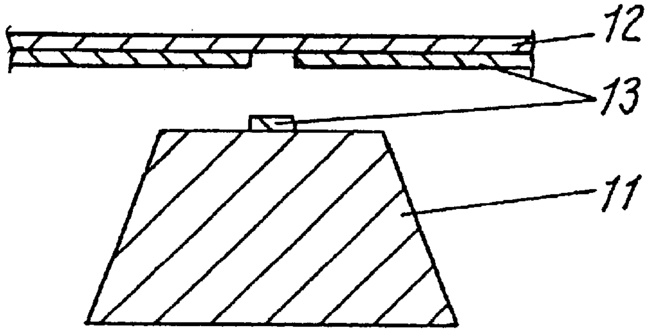
FIG. 4 is a sectional view showing a marking finished state in the first embodiment.

FIG. 1 is a front view for explaining a marking method on a resin molding in accordance with a first embodiment of the present invention. FIG. 2 is a perspective view showing a marking execution state. FIG. 3 is a perspective view showing a completed marking. FIG. 4 is a sectional view showing a finished marking and paint transferred state.

Referring to FIGS. 1–4, a marking apparatus comprises a laser beam generator 16, a deflector 15 for controlling deflection of a laser beam, a laser beam 14 controlled by the deflector 15, a support stand 17 for positioning and supporting a resin molding 11, and a paint 13 disposed to one side of a film 12 made of polyethylene terephthalate (PET) . The upper surface of the resin molding 11 in this embodiment has a flat shape. The PET film 12 is made of a thermoplastic heat resistant resin. The PET film 12 is colorless and transparent. The thickness of the film 12 is preferred to be in a range of about 10 micrometer to about 200 micrometer. The PET film having this thickness has an adequate strength, and when marking by using the marking apparatus, it is easy to handle. The PET film of this thickness also has an excellent transmissivity to laser beam. If the thickness of the film 12 is less than 10 micrometer, the film may be torn. If the thickness of the film 12 exceeds 200 micrometer, the contact of the film 12 and the molding may be inferior. Further, the PET film has a fine or smooth surface of smaller surface roughness than the surface of the resin molding 11. That is, the resin molding 11 has a surface roughness so as to receive the molten or sublimated paint. The deflector 15 controls the deflection of the laser beam by the numerical control (NC) data.

The marking procedure by such a marking apparatus is explained below. At a specified position beneath the deflector 15, the resin molding 11 is placed and positioned. Next, a film coated with the paint 13 on one side is prepared. The surface of the paint 13 of the film 12 held parallel to the upper surface of the resin molding 11 is pressed so as to contact the upper surface of the resin molding 11. Then, the laser beam 14 emitted from the laser beam source 16 is emitted with a specified intensity to the second surface opposite to the coating side of the paint 13 of the film 12 through the deflector 15. The laser beam 14 generates heat locally by acting on the film 12 and the paint 13 at its lower side and the resin molding 11 beneath it.

By this heat, the paint 13 is melted, and is transferred and disposed onto the surface of the resin molding 11 having a coarser surface than the film 12. Herein, the emitting position of the laser beam 14 is moved by the deflector 15 according to the NC data. The paint in the melted portion locally heated by the irradiation with the laser beam is cooled naturally, and is affixed to the surface of the resin molding 11. In other portion after moving of the laser 14, the paint is heated and changed similarly. By operating such action continuously, as shown in FIG. 3 and FIG. 4, the paint 13 is transferred from the film 12 to the surface of the resin molding 11. In this method, a mark 18 such as desired character or pattern is formed on the surface of the resin molding 11.

Thus, according to the first embodiment, the paint disposed on the film can be easily transferred to the surface of the resin molding. Moreover, plural films provided with paints of different colors at one side may be sequentially used as required. In this method, various color marks can be formed on the surface of individual resin moldings, and also a plurality of marks of different colors may be easily formed on the surface of one resin molding.

Figure 5:
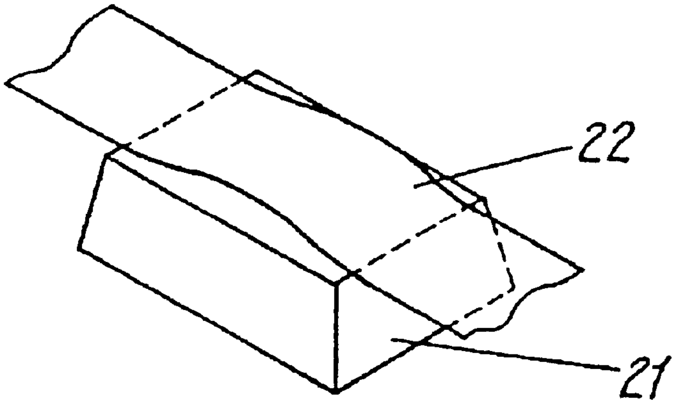
FIG. 5 is a perspective view showing deflection of a film on a wide molding surface.
Figure 6:
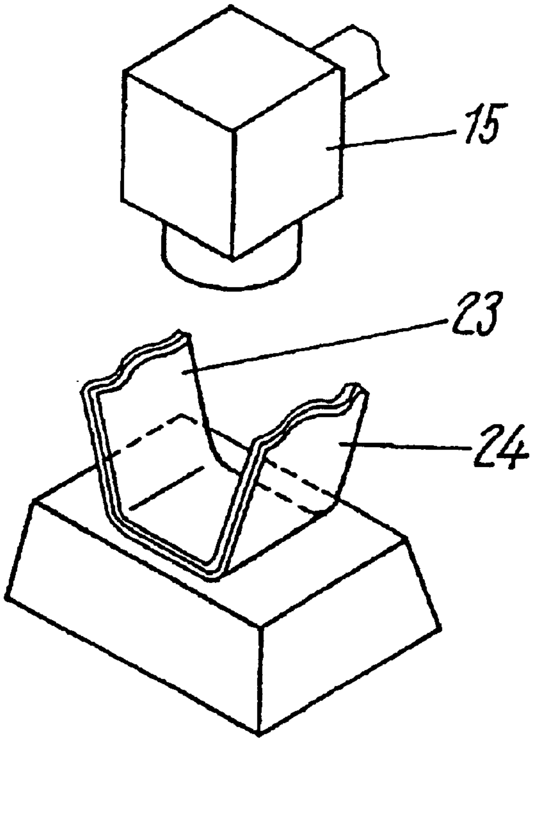
FIG. 6 is a perspective view showing a film adhering method to the wide molding surface in the first embodiment.

In the foregoing embodiment, the film 12 is held parallel to the surface of the resin molding 11, but other methods as shown in FIG. 5 to FIG. 9 are also possible. As shown in FIG. 5, in which the marking area of the resin molding 21 is relatively wide, if the foregoing marking method of holding a film 22 parallel to the surface of a resin molding 21 is employed, deflection is caused on the surface of the resin molding 21, and the contact between the film 22 and resin molding 21 is degraded. To prevent this, a marking method as shown in FIG. 6 is utilized. In FIG. 6, a film 23 having a thickness of about 75 microns is used. At a position above the resin molding 21, the film 23 is deflected and held in a U-form such that the paint 24 applied to one side of film 23 contacts the resin molding. The film 23 is pressed only at the marking position of the resin molding 21. The film 23 bent in a U-form maintains its U-form, and contacts with the surface of the molding 21, so that the surface of the paint 24 contacts the surface of the molding 21.

Figure 7:
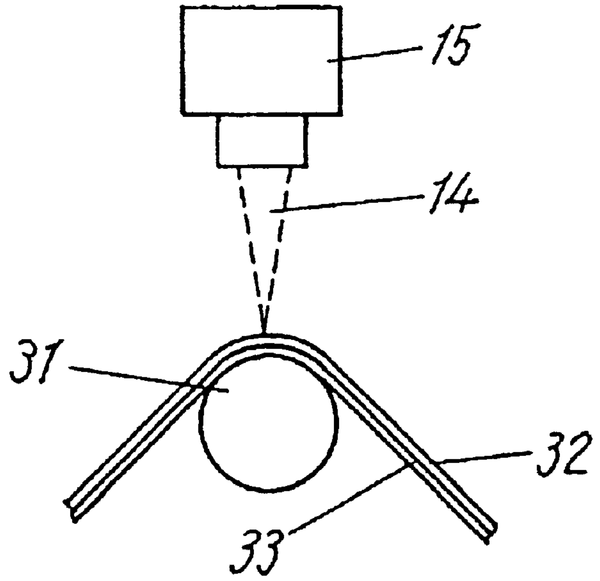
FIG. 7 is a front view showing a film adhering method to a molding having a convex surface in the first embodiment.

Alternatively, in FIG. 7, the surface of a resin molding 31 to be marked has a convex circle. In this case, the side of the film 32 to which paint 33 is applied is placed in contact with the resin molding 31, and by pulling the film 32 from both sides with a proper force while maintaining this state, the film 32 tightly contacts the surface of the circular resin molding 31.

Figure 8:
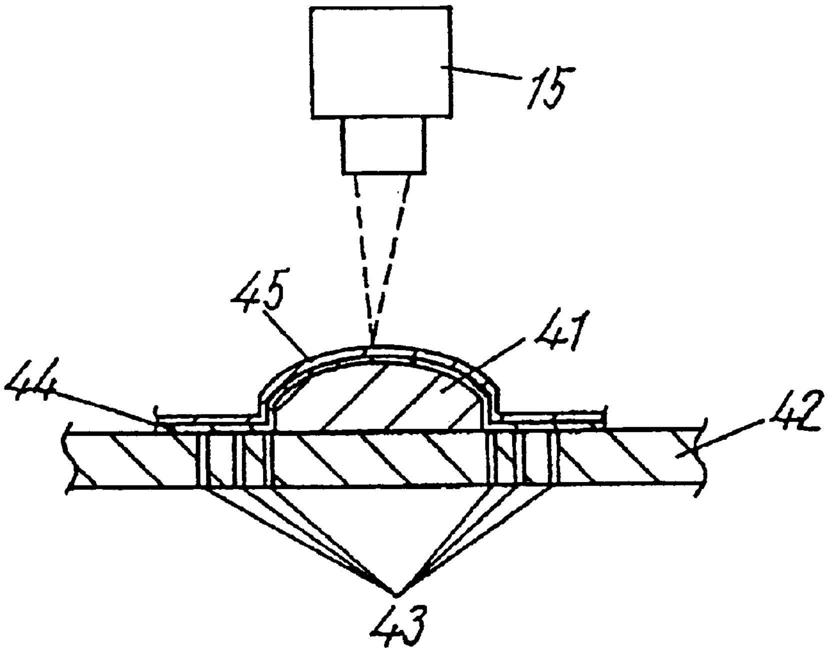
FIG. 8 is a sectional view showing a film adhering method to a molding having a convex surface in the first embodiment.

In FIG. 8, the surface shape of a resin molding 41 is convex. A support stand 42 for positioning and holding the resin molding 41 has a plurality of through-pores 43. A film 45 is put on the resin molding 41 placed on the support stand 42 so that the side of the film 45 to which paint is applied contacts the resin molding 41, the covering film 45 is evacuated through the through-pores 43 on the outer circumference of the resin molding 41. In this state, a laser beam 14 is emitted. In this method, the film 45 tightly contacts the resin molding 41 with a convex surface shape. In this case, it is recommended to use the film having a thickness of about 10 microns to about 25 microns. If the film thickness is less than 10 microns, the film may be torn. If the film thickness exceeds 25 microns, the contact between the film and molding may degrade.

Figure 9:
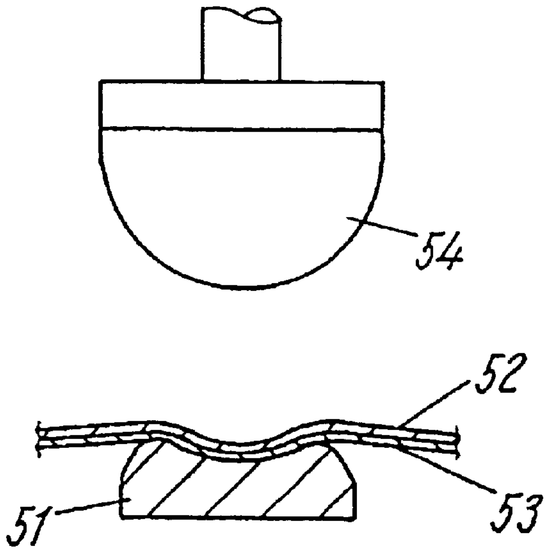
FIG. 9 is a sectional view showing a film adhering method on a molding having a concave surface in the first embodiment.

Further, in FIG. 9, the surface of a resin molding 51 has a concave shape. In this case, a paint 53 disposed on a film 52 contains an acrylic resin, which acts as an adhesive having a peelable tacky adhesiveness. On the concave surface of the resin molding 51, the surface of the film 52 to which the paint 53 is applied contacts the molding 51. The opposite side of the film 52 is pressed by using an elastic piece 54 in a shape corresponding to the concave shape, and the film 52 and the paint 53 are adhered and held in the concave shape of the resin molding 51. In this method, the surface of the paint 53 can be securely contacted to the surface of the resin molding 51, and after finishing the marking, the film 52 can be easily peeled off.

According to the marking methods illustrated in FIG. 6 to FIG. 9, if the surface of the resin molding has a complicated shape such as spherical, convex, or concave shape or has an extremely wide area, the surface of the paint installed at one side of the film can be securely contacted to the surface of the molding. The paint fused by irradiation with laser beam is transferred and marked to the surface of the resin molding with excellent precision.

In the current embodiment, while a laser beam is used, the present invention is not limited to this. Any energy ray having high energy such as electron beam, electron ray or heat ray capable of melting the paint can be used.

Exemplary Embodiment 2

Figure 10:
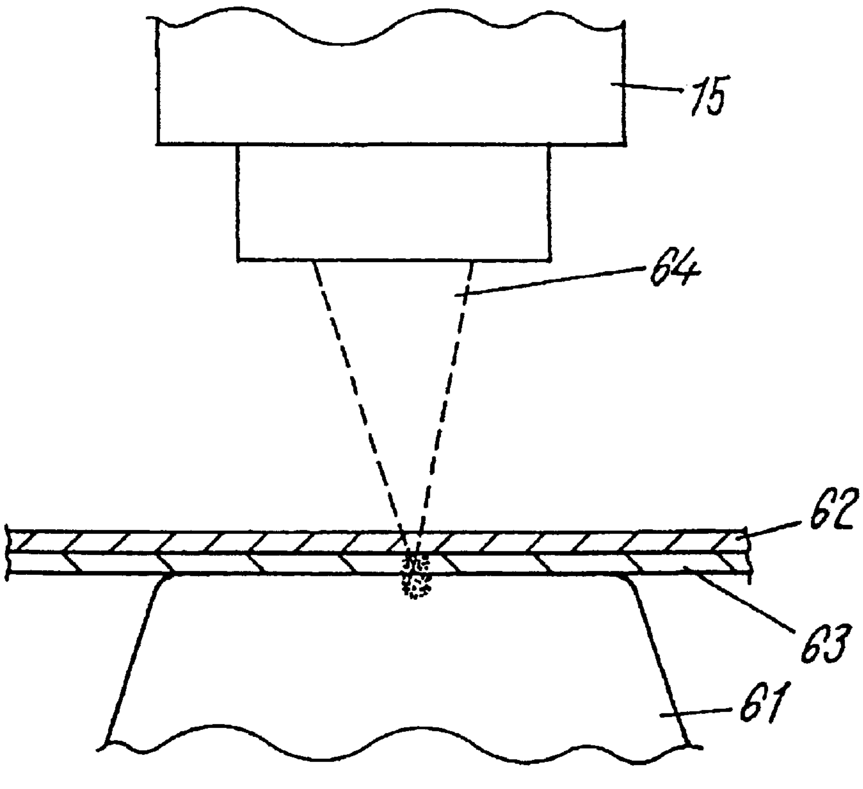
FIG. 10 is sectional view for explaining a marking method according to a second embodiment of the present invention.

FIG. 10 is an sectional view illustrating a marking method in accordance with a second embodiment of the present invention. In FIG. 10, a sublimating paint 63 is disposed on one side of a PET colorless transparent film 62 which is a thermoplastic heat resistant resin. As the energy ray, a YAG layer beam 64 capable of obtaining a short wavelength is used. The YAG laser beam is a beam generated from an apparatus using yttrium-aluminum-garnet material. The other steps to the process are the same as in embodiment 1. In FIG. 10, the YAG laser beam 64 controlled by a deflector 15 completely penetrates through the film 62, and is concentrated and emitted to the dye 63 and the surface layer of the resin molding 61 beneath it. At this time, the sublimating dye 63 is vaporized, the texture of the surface layer of the resin molding 61 is activated, and the vaporized dye 63 easily permeates into the surface layer of the molding. Thus, the dye 63 is disposed on the molding 61, and a mark is formed on the surface of the molding 61.

In this method, the mark is formed by permeating the vaporized dye 63 on the activated surface layer of the resin molding 61, so that the mark having an excellent wear resistance is formed.

In the embodiment, while the resin molding 61 is flat, it is not limited to this shape. It may have a complicated shape as shown in FIG. 6 to FIG. 9, wherein the same contact is obtained as in embodiment 1, and the same effect as in embodiment 1 is obtained.

Exemplary Embodiment 3

Figure 11:
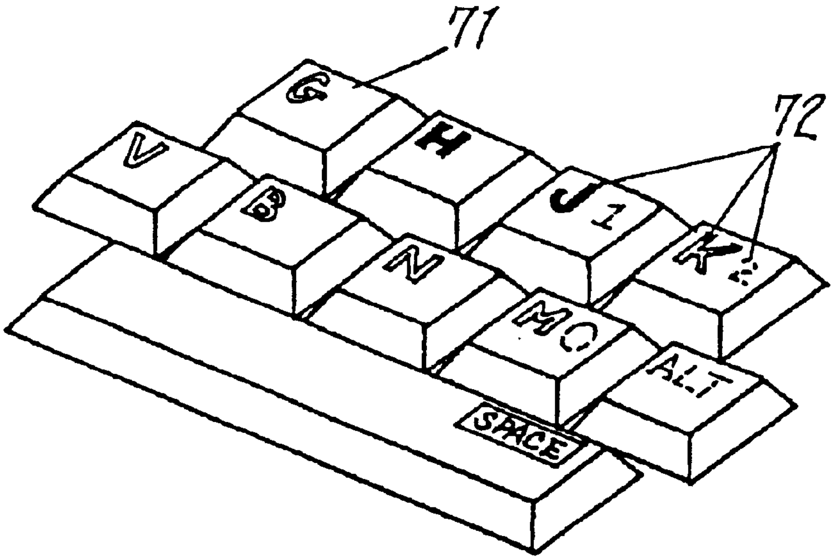
FIG. 11 is a perspective view of a keyboard as an input device used in an electronic information appliance manufactured by a marking method of the present invention.
Figure 12:
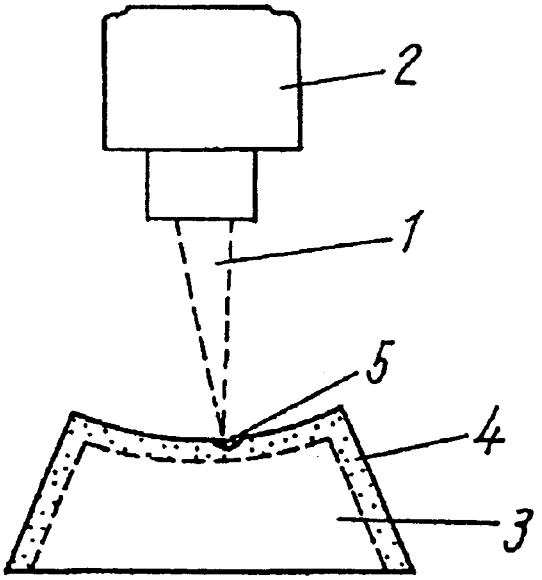
Fig. 12 PRIOR ART
FIG. 12 is a front view for explaining a marking method on a resin molding in a prior art.
Figure 13:
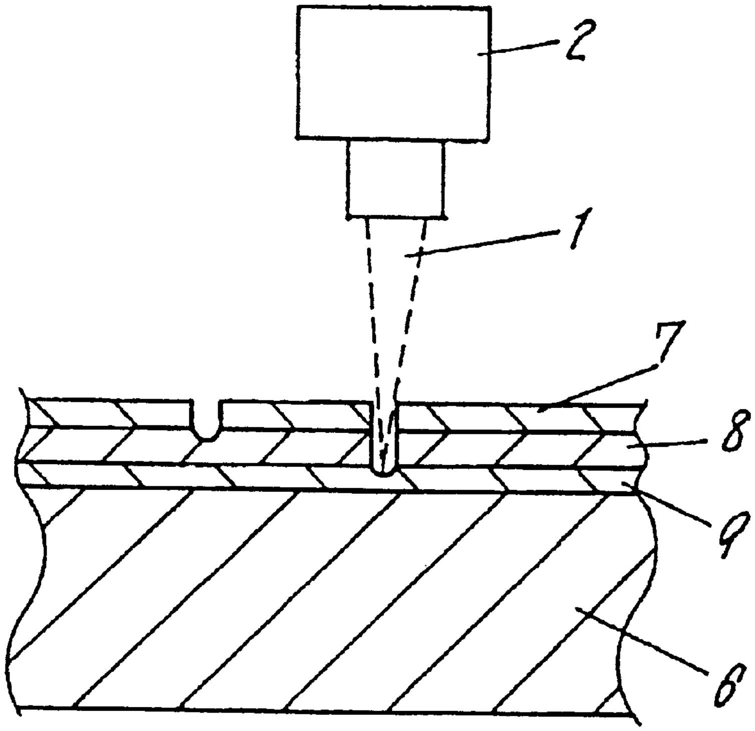
Fig. 13 PRIOR ART
FIG. 13 is an essential sectional front view for explaining a marking method on a resin molding in other prior art.

FIG. 11 shows an embodiment of a resin molding forming a mark by using the marking method of the present invention. Specifically, FIG. 11 is a partial perspective view of a keyboard as an input device used in an electronic information appliance or the like. In FIG. 11, marks 72 are formed on the surface of key tops 71 which are a plurality of resin moldings of an operation unit. The key tops 71 are made of a thermoplastic resin excellent in processability, and marks 72 are formed on the operation surface (i.e., upper surface). The marks 72 are formed by a method of emitting YAG laser beam by the same method as in embodiment 2, by using a plurality of films coated with sublimating dyes of different colors on one side. Paints of different colors are vaporized and permeate into the surface layer of the key tops 71, so that the plurality of marks 72 such as characters or patterns are clearly formed on the surface of the key tops 71 at high quality. The marks 72 have an excellent wear resistance.

In another variation, the present invention provides a method of forming a mark having a plurality of colors on the molding. The method comprises the following exemplary steps. Step (a): feeding a plurality of films, each of which has a first surface and a second surface. Step (b): disposing paints on the first surface of each of the plurality of films, wherein each film has a different color paint disposed thereon. Step (c): positioning one of the plurality of films on the surface of the molding so that the paint disposed on the film contacts the surface of the molding, and then emitting an energy ray form the second surface of the film. The energy ray causes the paint disposed on the first surface of the film to be transferred onto the surface of the molding, thereby forming one color on the molding. Step (d): positioning a second of the plurality of films, which has a different color than the first film, on the surface of the molding so that the paint disposed on the film contacts the surface of the molding, and then emitting an energy ray form the second surface of the film. The energy ray causes the paint disposed on the first surface of the film to be transferred onto the surface of the molding, thereby forming a second color on the molding. Step (e): repeating step (d) until all of the desired colors are transferred to the molding.

In the foregoing embodiments, while a colorless transparent film is used, the present invention is not limited to this. A colored translucent film may be used depending on the kind of the laser beam or the color of the applied paint.

Thus, according to the present invention, by the deflection control by NC data, desired characters or patterns can be marked on the surface of the molding. Marks of various colors can be also formed. Moreover, the marks can be formed on the molding at lower cost. Marks having excellent wear resistance can be further formed. In addition, marks of excellent precision can be formed on the surface of the molding having complicated shapes.

What is claimed is:

1. A method of forming a mark on a molding comprising the steps of:

(a) providing a film having a first surface and a second surface, (b) disposing a paint on said first surface of said film, said paint having a lower melting point than said film, said paint including an adhesive having a peelable tacky adhesiveness, (c) positioning said film on a surface of the molding so that said paint adheres to the surface of said molding, and (d) forming the mark by irradiating an energy ray onto a predetermined portion of said second surface of said film, wherein said paint positioned on a portion of the first surface of the film adjacent to said predetermined portion is transferred and disposed onto the surface of the molding.

2. The method of claim 1, wherein said molding is a resin molding formed of a material containing resin.

3. The method of claim 1, wherein said molding is a resin molding formed of a material containing thermoplastic resin.

4. The method of claim 1, wherein emission of said energy ray is controlled by a deflection device.

5. The method of claim 1, wherein said molding has a curved surface and at said step (c), said paint disposed on said film is in tight contact with said curved surface of said molding.

6. The method of claim 1, wherein said molding has a flat surface, and at said step (c), said painting disposed on said film is in tight contact with said flat surface of said molding.

7. The method of claim 1, wherein said molding has a coarser surface roughness than said first surface of said film, and said paint is transferred to said coarser surface of said molding.

8. The method of claim 1, wherein said energy ray irradiates said paint by passing through said film without causing any effects on said film.

9. The method of claim 1, wherein said energy ray is a laser beam.

10. The method of claim 1, wherein said paint has a specific color, and said mark has said specific color.

11. The method of claim 1, wherein said paint contains at least one element selected from the group consisting of dye and pigment.

12. The method of claim 1, wherein said paint is melted by irradiation with said energy ray, and transferred to said surface of said molding.

13. The method of claim 1, wherein said paint is melted by irradiation with said energy ray, said molding is a resin molding formed of a material containing resin, when said paint is irradiated with said energy ray, the surface of said resin molding forms an activated surface layer, and said paint is melted and the melted paint is disposed over said surface of said molding to form said mark.

14. The method of claim 1, wherein said paint is sublimated when irradiated with said energy ray, and transferred to said surface of said molding.

15. The method of claim 1, wherein said paint is sublimated when irradiated with said energy ray, said molding is a resin molding formed of a material containing resin, when said paint is irradiated with said energy ray, the surface of said resin molding forms an activated surface layer, and said paint is sublimated and the sublimated paint is disposed over said surface of said molding to form said mark.

16. The method of claim 1, wherein said energy ray is a laser beam, said laser beam created by a laser using yttrium-aluminum-garnet material.

17. The method of claim 1, wherein said film has at least one of transparent and translucent properties with respect to said energy ray.

18. The method of claim 1, wherein said film has a property of maintaining thermal characteristics as without melting, even during irradiation of said energy ray.

19. The method of claim 1, wherein said film has a thickness in a range from about 10 microns to about 200 microns.

20. The method of claim 1, wherein at said step (c), said film is deformed in a U-form and at said step (d), said energy ray is emitted onto a concave portion of said film in said U-form.

21. The method of claim 1, wherein said molding has a convex surface, at said step (c), said film is pulled from opposite ends of said film and deformed so that said first surface of said film on which said paint is disposed conforms to a shape of said convex surface so as to contact said convex surface of said molding.

22. The method of claim 1, wherein said molding has a convex surface, at said step (c), said film is evacuated from a side of said first surface and deformed so that said first surface of said film on which said paint is disposed conforms to a shape of said convex surface so as to contact said convex surface of said molding.

23. The method of claim 1, wherein at said step (c), a deformable elastic piece presses said second surface of said film to the surface of said molding so that the first surface of said film on which said paint is disposed conforms to a shape of the surface of said molding, then said elastic piece is released from said second surface and said film is maintained in a position conforming to said shape of the surface of said molding.

24. The method of claim 1, wherein: at said step (a), a plurality of films are provided, at said step (b), a plurality of paints are provided, where each of said plurality of paints has mutually different color, one of said plurality of paints is disposed on the first surface of one of said plurality of films, another of said plurality of paints is disposed on the first surface of another of said plurality of films, and a mark having a plurality of colors is formed on the surface of said molding, by using each of said plurality of said paints disposed respectively on each of said plurality of said films.

25. The method of claim 5, wherein said curved surface is a surface selected from at least one of the group consisting of concave, convex, and convex-concave.

26. A method of forming a mark on a molding comprising the steps of:

(a) providing a film having a first surface and a second surface, (b) disposing a paint layer on said first surface of said film, said paint layer having a lower melting point than said film, said paint layer including a paint component and an adhesive, said adhesive having a peelable tacky adhesiveness, (c) positioning said film on a surface of the molding so that said paint layer adheres to the surface of said molding, (d) irradiating an energy ray onto a predetermined portion of said second surface of said film, wherein said paint component positioned on a portion of the first surface of the film adjacent to said predetermined portion is transferred and disposed onto the surface of the molding, and (e) peeling said paint layer and said film from said molding, wherein the mark is formed on the molding by said paint component which was transferred.

27. The method of claim 26 wherein said molding has a concave shape, at said step (c), a deformable elastic piece is pressed from said second surface side to push said film to the surface of said molding so that the first surface of said film on which said paint layer is disposed conforms to the concave shape of the surface of said molding, then said elastic piece is released from said second surface and said film is maintained in a position conforming to said concave shape of the surface of said molding.

28. A method of forming a mark on a molding comprising the steps of:

(a) providing a film having a first surface and a second surface, (b) disposing a paint layer on said first surface of said film, said paint layer having a lower melting point than said film, said paint layer including a paint component and an adhesive, said adhesive having a peelable tacky adhesiveness, (c) positioning said film on a surface of the molding so that said paint layer contacts the surface of said molding, (d) irradiating an energy ray onto a predetermined portion of said second surface of said film, wherein the surface of the molding positioned next to a portion of the first surface of the film adjacent to said predetermined portion is heated and defines a heated portion, and at the same time, said paint component positioned on said portion of the first surface of the film adjacent to said predetermined portion is transferred and disposed onto the heated portion of the molding, and (e) peeling said paint layer and said film from said molding, wherein the mark is formed on the molding by said paint component which was transferred.

29. The marking method of claim 28, wherein said energy ray is a laser beam, and said film has a thickness in a range from about 10 microns to about 200 microns.

30. The marking method of claim 28, wherein said molding made of a resin molding.

31. The marking method of claim 28, wherein said paint component is melted by irradiation with said energy ray, and when said film is irradiated, said paint components is melted and transferred to said heated portion of said molding.

32. The marking method of claim 28, wherein said paint component is sublimated by irradiation with said energy ray, and when said film is irradiated, said paint component is sublimated and transferred to said heated portion of said molding.

33. The marking method of claim 28, wherein said paint layer further includes an adhesive, at said (c) step, said paint layer is adhered on the surface of said molding.

34. The marking method of claim 28, wherein said paint layer further includes an adhesive, said molding has a convex surface, at said (c) step, said paint layer is adhered on the convex surface of said molding.

35. A method of forming a mark on a molding comprising the steps of:

(a) providing a film having a first surface and a second surface, (b) disposing a paint layer on said first surface of said film, said paint layer having a lower melting point than said film, said paint layer including a paint component and an adhesive, said adhesive having a peelable tacky adhesiveness, (c) positioning said film on a surface of the molding so that said paint layer contacts the surface of said molding, wherein said molding has a convex surface, wherein a space adjacent a to side of the first surface is evacuated and said films deformed so that said first surface of said film on which said paint layer is disposed conforms to a shape of said convex surface so as to contact said convex surface of said molding, (d) irradiating an energy ray onto a predetermined portion of said second surface of said film positioned on said convex surface of said molding, wherein said paint component positioned on a portion of the first surface of the film adjacent to said predetermined portion is transferred and disposed onto the molding, and (e) peeling said paint layer and said film from said molding, wherein the mark is formed on said convex surface of said molding by said paint component which was transferred.

* * * * *

UNITED STATES PATENT AND TRADEMARK OFFICE

CERTIFICATE OF CORRECTION

PATENT NO. : 6,245,397 B1
DATED : June 12, 2001
INVENTOR(S) : Kazuyuki Watanabe et al.

It is certified that error appears in the above-identified patent and that said Letters Patent is hereby corrected as shown below:

Title page,
Item [22] Filed:, please change the date from "Dec. 15, 1998" to -- Dec. 14, 1998 --.

Signed and Sealed this

Seventh Day of January, 2003

JAMES E. ROGAN
*Director of the United States Patent and Trademark Office*